(12) United States Patent
Kim

(10) Patent No.: US 12,543,431 B2
(45) Date of Patent: Feb. 3, 2026

(54) LIGHT EMITTING DISPLAY DEVICE

(71) Applicant: LG Display Co., Ltd., Seoul (KR)

(72) Inventor: Mi Na Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 424 days.

(21) Appl. No.: 18/259,264

(22) PCT Filed: Nov. 12, 2021

(86) PCT No.: PCT/KR2021/015719
§ 371 (c)(1),
(2) Date: Jun. 23, 2023

(87) PCT Pub. No.: WO2022/145678
PCT Pub. Date: Jul. 7, 2022

(65) Prior Publication Data
US 2024/0065020 A1  Feb. 22, 2024

(30) Foreign Application Priority Data
Dec. 31, 2020  (KR) .......... 10-2020-0190022

(51) Int. Cl.
*H10K 50/18* (2023.01)
*H10K 59/00* (2023.01)
*H10K 59/80* (2023.01)
*H10K 101/40* (2023.01)

(52) U.S. Cl.
CPC ......... *H10K 50/181* (2023.02); *H10K 59/771* (2023.02); *H10K 59/876* (2023.02); *H10K 2101/40* (2023.02)

(58) Field of Classification Search
CPC .............. H10K 50/181; H10K 59/771; H10K 59/876; H10K 2101/40; H10K 59/352; H10K 85/631; H10K 85/636; H10K 85/6574; H10K 2101/30; H10K 59/35; H10K 50/11
See application file for complete search history.

(56) References Cited

U.S. PATENT DOCUMENTS

| | | |
|---|---|---|
| 2014/0054556 A1 | 2/2014 | Park et al. |
| 2015/0060775 A1 | 3/2015 | Liang et al. |
| 2018/0047925 A1 | 2/2018 | Kim et al. |
| 2019/0372060 A1* | 12/2019 | Li .................. H10K 50/131 |

FOREIGN PATENT DOCUMENTS

| | | |
|---|---|---|
| KR | 101464270 B1 | 11/2014 |
| KR | 20160022989 A | 3/2016 |
| KR | 20180017901 A | 2/2018 |
| KR | 20180062205 A | 6/2018 |

* cited by examiner

*Primary Examiner* — Mohammad A Rahman
(74) *Attorney, Agent, or Firm* — Seed Intellectual Property Law Group LLP

(57) ABSTRACT

Disclosed is a light emitting display device configured such that the construction of an electron blocking unit located adjacent to an emission layer is differently applied to sub-pixels having different turn-on voltages, thereby preventing current leakage and reducing power consumption, thereby improving efficiency and visual sensation of the display device.

18 Claims, 8 Drawing Sheets

231/232
(EBU1)

232/233
(EBU2)

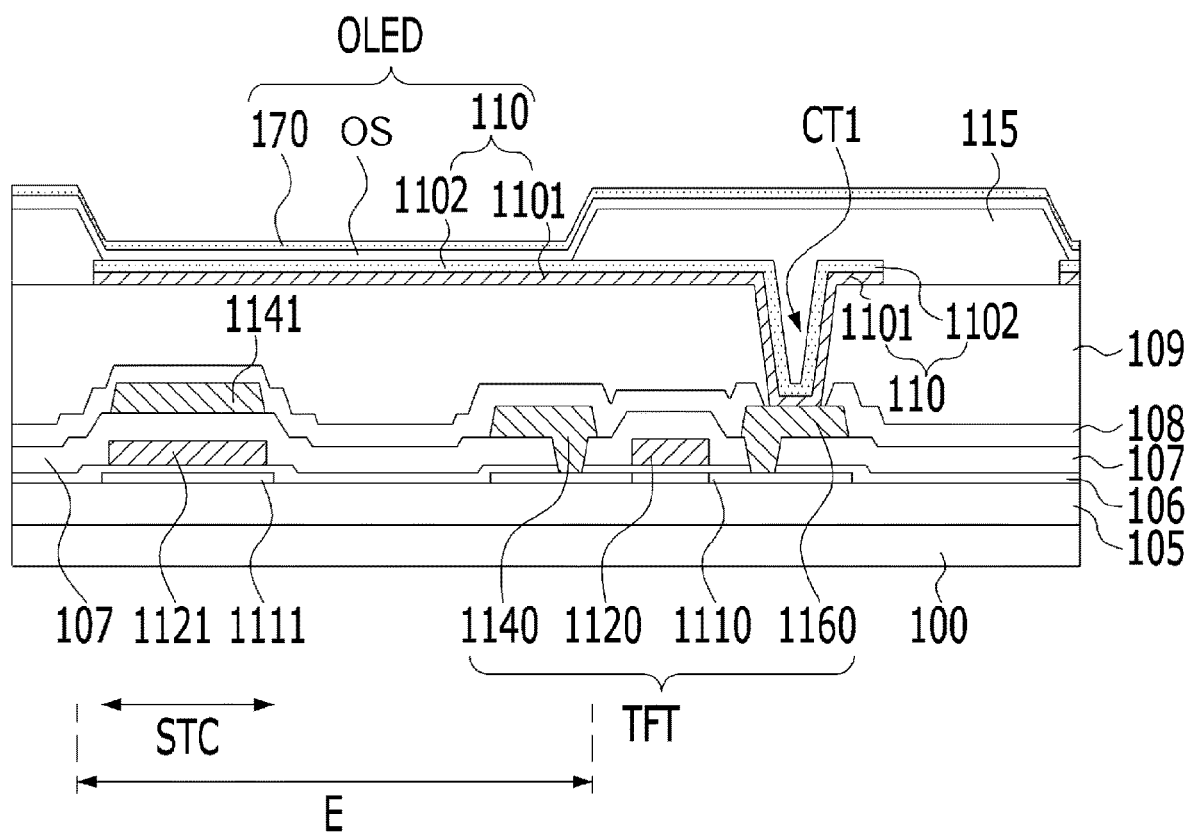

LIGHT EMITTING DISPLAY DEVICE

BACKGROUND

Technical Field

The present disclosure relates to a display device, and more particularly to a light emitting display device configured such that the internal structure of an element is changed for each subpixel, whereby it is possible to prevent current leakage.

Description of the Related Art

With recent approach to a full-scale information age, displays capable of visually expressing electrical information signals have been rapidly developed. Correspondingly, various display devices having excellent performance, such as slimness, light weight, and low power consumption, have been developed and have rapidly replaced a conventional cathode ray tube (CRT).

Among the display devices, a light emitting display device having a light emitting element in a display panel has been considered as a competitive application in order to achieve compactness of the device and vivid color display without necessity of a separate light source.

BRIEF SUMMARY

A display device includes a plurality of subpixels, and the subpixels include different color emission layers in order to express various colors.

A light emitting display device including a light emitting element includes a plurality of organic functional layers in order to achieve effective light emission in an emission layer. However, these organic functional layers are common for subpixels, whereby the organic functional layers become a path of leakage current to adjacent subpixels, and leakage light is generated due to the leakage current, which are problems to be solved.

The present disclosure has been made in view of the various technical problems in the related art including above-identified problems. One or more embodiments of the present disclosure change the internal structure of a light emitting element, thereby solving a leakage current problem, and reduce driving voltage and power consumption, thereby improving efficiency and visual sensation of a light emitting display device.

A light emitting display device according to the present disclosure is configured such that the construction of an electron blocking unit located adjacent to an emission layer is differently applied to subpixels having different threshold voltages, thereby preventing current leakage.

A light emitting display device according to an embodiment of the present disclosure includes a first subpixel and a second subpixel each including an anode and a cathode opposite each other and a first common layer and a second common layer provided between the anode and the cathode, a first emission layer provided between the first and second common layers of the first subpixel, a second emission layer provided between the first and second common layers of the second subpixel, a first electron blocking unit provided between the first common layer and the first emission layer of the first subpixel, the first electron blocking unit including at least two layers arranged such that energy bandgaps thereof are increased, and a second electron blocking unit provided between the first common layer and the second emission layer of the second subpixel, the second electron blocking unit including at least two layers arranged such that energy bandgaps thereof are decreased.

A light emitting display device according to another embodiment of the present disclosure includes first to third subpixels each including an anode and a cathode opposite each other and a first common layer and a second common layer provided between the anode and the cathode, a first emission layer and a second emission layer provided between the first and second common layers of each of the first and second subpixels, respectively, a first electron blocking unit provided between the first common layer and the first and second emission layers of the each of the first and second subpixels, the first electron blocking unit including at least two layers arranged such that energy bandgaps thereof are increased, and a second electron blocking unit provided between the first common layer and a third emission layer of the third subpixel, the second electron blocking unit including at least two layers arranged such that energy bandgaps thereof are decreased.

The light emitting display device according to the present disclosure includes, but not limited to, the following technical benefits.

First, in the light emitting display device according to the present disclosure, the electron blocking unit, which is configured to prevent overflow of electrons or excitons from the emission layer, is constituted by a plurality of layers, and in subpixels including color emission layers having different threshold voltages, electron blocking units adjacent to different color emission layers have different electron blocking layers. That is, in the same stack structure, an electron blocking layer abutting a color emission layer having a relatively high turn-on voltage, among color emission layers having a relative difference in threshold voltage, has high hole mobility in order to reduce threshold voltage, whereby the difference in threshold voltage between subpixels is reduced or minimized. Consequently, it is possible to prevent emission of another color of light due to leakage when a specific subpixel is turned on.

Second, the electron blocking unit has a current supply compensation function for an emission layer having an energy bandgap different from the energy bandgaps of the other color emission layers due to characteristics of light emission or characteristics of material, whereby it is possible to reduce driving voltage and to improve efficiency.

BRIEF DESCRIPTION OF THE SEVERAL VIEWS OF THE DRAWINGS

FIG. 7 is a sectional view showing connection between a light emitting element and a thin film transistor according to an example in the light emitting display device of the present disclosure.

DETAILED DESCRIPTION

Figure 1:
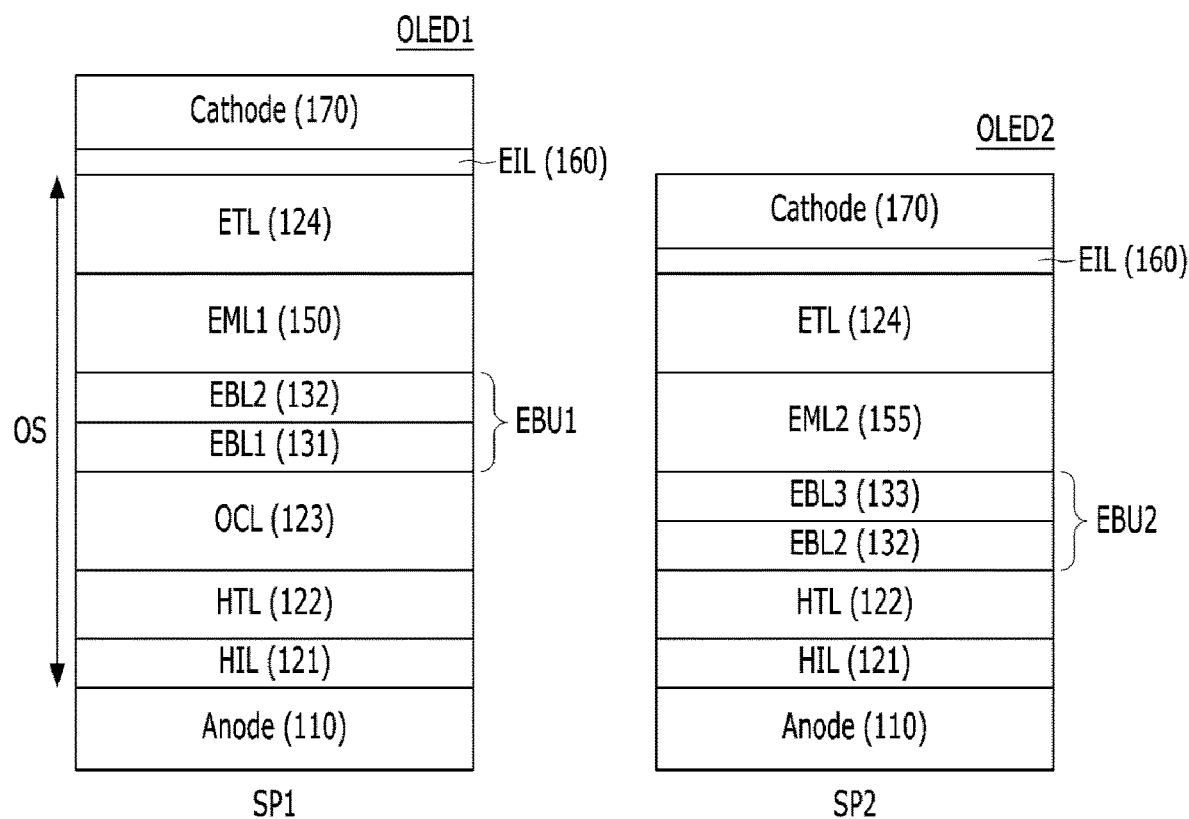
FIG. 1 is a sectional view showing a light emitting display device according to a first embodiment of the present disclosure.
Figure 2A:
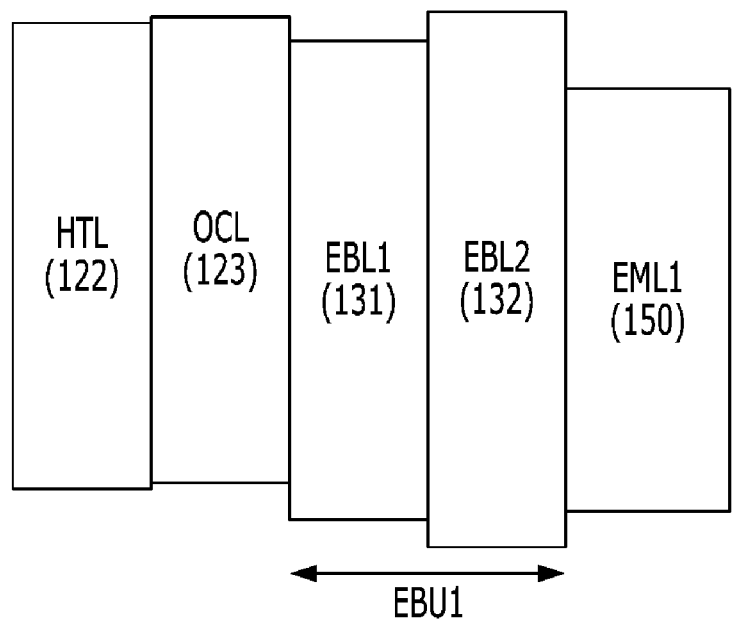
FIGS. 2A and 2B are energy band diagrams of respective emission layer and adjacent layers of electron blocking units at a first subpixel and a second subpixel of FIG. 1.
Figure 2B:
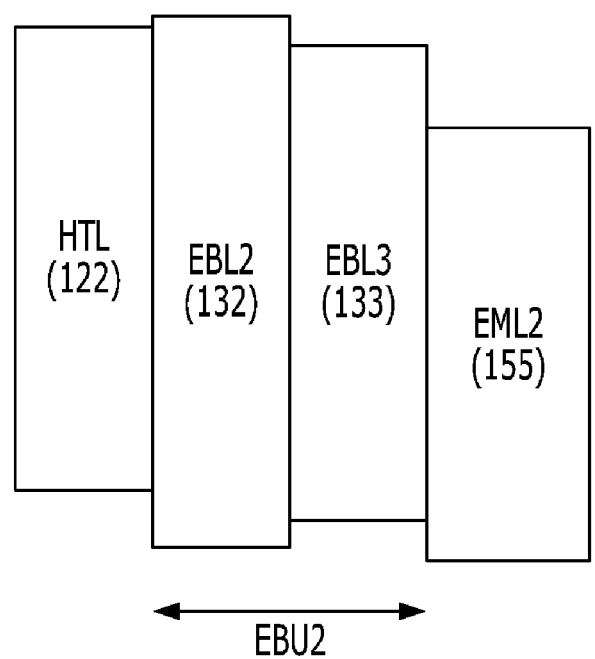

FIG. 1 is a sectional view showing a light emitting display device according to a first embodiment of the present disclosure. FIGS. 2A and 2B are adjacent layer-specific energy band diagrams of emission layers and electron blocking units of a first subpixel and a second subpixel of FIG. 1.

As shown in FIG. 1, in the light emitting display device according to the first embodiment of the present disclosure, a first subpixel SP1 and a second subpixel SP2 include first and second light emitting elements OLED1 and OLED2 including first and second emission layers 150 and 155 configured to emit different colors of light and first and second electron blocking units EBU1 and EBU2 adjacent to the first and second emission layers 150 and 155, respectively.

Each of the first subpixel SP1 and the second subpixel SP2 includes an anode 110, a first common layer HIL/HTL, a second common layer ETL/EIL, and a cathode 170.

The first subpixel SP1 may include a first emission layer 150 provided between the first common layer HIL/HTL and the second common layer ETL/EIL, a first electron blocking unit EBU1 disposed between the first common layer HIL/HTL and the first emission layer (EML1) 150. In the first electron blocking unit EBU1, at least two layers EBL1 and EBL2 are arranged such that energy bandgaps thereof are increased, as shown in FIG. 2A.

The second subpixel SP2 may include a second emission layer 155 provided between the first and second common layers HIL/HTL and ETL/EIL and a second electron blocking unit EBU2 disposed between the first common layer HIL/HTL and the second emission layer (EML2) 155. In the second electron blocking unit EBU2, at least two layers EBL2 and EBL3 are arranged such that energy bandgaps thereof are decreased, as shown in FIG. 2B.

Here, the first common layer under the first emission layer EML1 150, which is a layer related to hole injection and hole transport, may include a hole injection layer HIL 121 and a hole transport layer HTL 122. The hole injection layer HIL 121 and the hole transport layer HTL 122 may be identically configured in the first and second subpixels SP1 and SP2.

The second common layer over the second emission layer 155 may include an electron transport layer ETL 124. The second common layer may further comprise an electron injection layer EIL 160 on the electron transport layer ETL 124. Depending on circumstances, the second common layer may be constituted by a stack of a hole blocking layer HBL and an electron transport layer ETL.

In the light emitting display device according to the present disclosure, the first electron blocking unit EBU1 may be constituted by a stack of a first electron blocking layer 131 and a second electron blocking layer 132, and the second electron blocking unit EBU2 may be constituted by a stack of the second electron blocking layer 132 and a third electron blocking layer 133.

Here, the second electron blocking layer 132 may extend over the first and second subpixels SP1 and SP2, the first electron blocking layer 131 may be provided in only the first subpixel SP1, and the third electron blocking layer 133 may be provided in only the second subpixel SP2.

Here, the first electron blocking layer 131 and the third electron blocking layer 133 may include the same material. When the first electron blocking layer 131 and the third electron blocking layer 133 include the same material, the first electron blocking layer 131 may be formed by shifting a mask in the same chamber as the third electron blocking layer 133, whereby there are advantages in that material cost is reduced and no equipment is added at the time of structural change.

However, the present disclosure is not limited thereto. As long as the electron blocking layers are arranged in the first electron blocking unit EBU1 such that the energy bandgaps are increased and the electron blocking layers are arranged in the second electron blocking unit EBU2 such that the energy bandgaps are decreased, it is possible to prevent side leakage of current to adjacent subpixels. For example, the first electron blocking layer 131 and the third electron blocking layer 133 may not be identical to each other.

In the light emitting display device according to the present disclosure, each of the first and second electron blocking units EBU1 and EBU2, which are configured to prevent overflow of electrons or excitons from the first and second emission layers 150 and 155 to the first common layer HIL/HTL, is constituted by a plurality of layers. The difference in threshold voltage Vth between the subpixels SP1 and SP2 including the first and second emission layers 150 and 155 having different threshold voltages Vth is compensated for by the first and second electron blocking units EBU1 and EBU2, whereby high threshold voltage Vth of the second emission layer 155, and therefore the difference in threshold voltage between the first and second subpixels is reduced and driving voltage is reduced. That is, the difference in threshold voltage between the subpixels is reduced, whereby it is possible to prevent emission of another color of light due to leakage when a subpixel including a color emission layer having high threshold voltage is driven.

Here, the second electron blocking layer 132 may have a highest occupied molecular orbital (HOMO) level 0.1 eV or more lower than the HOMO level of each of the first and third electron blocking layers 131 and 133, and may have a lowest unoccupied molecular orbital (LUMO) level 0.1 eV or more higher than the LUMO level of each of the first and third electron blocking layers. That is, the second electron blocking layer 132 is made of a material having a low (deep) HOMO level and a high (shallow) LUMO level such that the energy bandgap can cover the energy bandgap (|HOMO−LUMO|) of each of the first and third electron blocking layers 131 and 133.

Meanwhile, in the second electron blocking unit EBU2, the third electron blocking layer 133 abutting the second emission layer 155 may have a HOMO level 0.2 eV or more higher than the HOMO level of a host of the second emission layer 155, and the third electron blocking layer 133 may have a high hole mobility of $5 \times 10^{-4}$ cm$^2$/Vs or more. The hole mobility of the third electron blocking layer 133 is higher than the hole mobility of the second electron blocking layer 132. As a result, it is possible to rapidly and smoothly transport holes to the second emission layer 155 abutting the third electron blocking layer 133, whereby it is possible to reduce high threshold voltage of the second emission layer 155, which is inherent, and to increase driving voltage.

Meanwhile, each of the first and third electron blocking layers 131 and 133 may be made of an electron blocking material represented by, for example, Chemical Formula 1 below.

In addition, the second electron blocking layer 132 may be made of an electron blocking material represented by, for example, Chemical Formula 2 below.

In Chemical Formula 1 and Chemical Formula 2, an amine substituent is substituted at another position in a spirobifluorene derivative to adjust the HOMO level of the material. However, this is an example. Another material may be used as long as the material has electron excitation characteristics and each of the first and third electron blocking layers 131 and 133 has a HOMO level 0.2 eV or more higher than the HOMO level of the host of the second emission layer 155 while having a high hole mobility of $5 \times 10^{-4}$ cm$^2$/Vs or more. Another material may be used as long as the second electron blocking layer 132 has electron blocking characteristics and has a great energy bandgap sufficient to cover the bandgap of the material for each of the first and third electron blocking layers 131 and 133.

The HOMO and LUMO levels compared in this specification are based on a vacuum level, and have negative values. Consequently, that one of the two values is lower than the other means that the one is lower based on the vacuum level and has a greater absolute value.

When first and second electron blocking units EBU1 and EBU2 abutting first and second emission layers 150 and 155 having different threshold voltages while having different dispositions are used, as in the light emitting display device according to the present disclosure, it is possible to reduce the difference in threshold voltage between two subpixels to 0.4 V or less, to effectively reduce leakage current, and to prevent light leakage.

In the light emitting display device according to the present disclosure, as described above, electron blocking units abutting different emission layers have different electron blocking layers. That is, in the same stack structure, an electron blocking layer abutting a color emission layer having a relatively high turn-on voltage, among color emission layers having a difference in threshold voltage, has high hole mobility in order to reduce threshold voltage, whereby the difference in threshold voltage between subpixels is reduced or minimized. Consequently, it is possible to prevent emission of another color of light due to leakage when a specific subpixel is turned on.

In addition, the electron blocking unit has a current supply compensation function for an emission layer having an energy bandgap different from the energy bandgaps of the other color emission layers due to characteristics of light emission or characteristics of material, whereby it is possible to reduce driving voltage and to improve efficiency.

Meanwhile, in the first subpixel SP1, an optical compensation layer OCL 123 may be further provided between the hole transport layer 122 and the first electron blocking unit EBU1. When the first emission layer 150 and the second emission layer 155 are different from each other and the first emission layer 150 emits long-wavelength light, the position of the first emission layer 150 at which optimal resonance occurs between the anode 110 and the cathode 170 is different from the position of the second emission layer 155. The optical compensation layer is provided in order to compensate for the distance difference. The optical compensation layer 123 may be made of a hole transport material.

Depending on circumstances, the optical compensation layer may be made of the same material as the hole transport layer HTL (122) in the first common layer HIL/HTL.

In addition, an electron injection layer 160 may be further included between the cathode 170 and the second common layer. When the electron injection layer EIL 160 is an organic layer, the electron injection layer EIL 160 may be included in the second common layer. When the electron injection layer EIL 160 is made of an inorganic material including metal and/or halogen, the electron injection layer may be included as one of the constructions stacked on the cathode 170.

In the light emitting display device according to the present disclosure, one of the anode 110 and the cathode 170 may be a reflective electrode, and the other may be a transmissive electrode or a transflective electrode. The transmissive electrode may be made of indium tin oxide (ITO) or indium zinc oxide (IZO). The transflective electrode may be made of magnesium (Mg), silver (Ag), or zinc (Zn) or an alloy including at least one thereof. The reflective electrode may be made of at least one of silver, magnesium, aluminum, and zinc (Zn) or an alloy including some thereof.

Hereinafter, example embodiments of the present disclosure will be described with reference to the accompanying drawings. Throughout the specification, the same or similar elements are denoted by the same reference numerals. In the following description, a detailed description of known functions and configurations incorporated herein will be omitted when it may make the subject matter of the disclosure rather unclear. In addition, names of components used in the following description are selected in consideration of ease in preparing the specification, and may be different from names of parts of an actual product.

In the drawings for explaining the example embodiments of the present disclosure, for example, the illustrated shape, size, ratio, angle, and number are given by way of example, and thus, are not limitative of the disclosure of the present disclosure. Throughout the present specification, the same reference numerals designate the same constituent elements. The terms "comprises," "includes," and/or "has," used in this specification, do not preclude the presence or addition of other elements unless used along with the term "only." The singular forms are intended to include the plural forms as well, unless the context clearly indicates otherwise.

In the interpretation of constituent elements included in the various embodiments of the present disclosure, the constituent elements are interpreted as including an error range even if there is no explicit description thereof.

When describing positional relationships, for example, when the positional relationship between two parts is described using "on," "above," "below," "beside," or the like, one or more other parts may be located between the two parts unless the term "directly" or "closely" is used therewith.

When the temporal relationship between two actions is described using "after," "subsequently," "next," "before," or the like, the actions may not occur in succession unless the term "immediately" or "directly" is used therewith.

In the description of the various embodiments of the present disclosure, although terms such as, for example, "first" and "second" may be used to describe various elements, these terms are merely used to distinguish the same or similar elements from each other. Therefore, in the present specification, an element modified by "first" may be the same as an element modified by "second" within the technical scope of the present disclosure unless mentioned otherwise.

The respective features of the various embodiments of the present disclosure may be partially or wholly coupled to and combined with each other, and various technical linkages therebetween and operation methods thereof are possible. These various embodiments may be performed independently of each other, or may be performed in association with each other.

In this specification, the term "doped" means that a material of any layer, which has physical properties (e.g., N-type and P-type, or an organic material and an inorganic material) different from the material that occupies the greatest weight percentage of the corresponding layer, is added to the material accounting for the greatest weight percentage in an amount corresponding to a weight percentage of less than 30%. In other words, a "doped" layer means a layer in which a host material and a dopant material of any layer are distinguishable from each other in consideration of the weight percentages thereof. In addition, the term "undoped" refers to all cases excluding the case that corresponds to the term "doped". For example, when any layer is formed of a single material or is formed of a mixture of materials having the same or similar properties, the layer is an "undoped" layer. For example, when at least one of constituent materials of any layer is of a P-type and not all of the other constituent materials of the layer are of an N-type, the layer is an "undoped" layer. For example, when at least one of the constituent materials of any layer is an organic material and not all of the other constituent materials of the layer are an inorganic material, the layer is an "undoped" layer. For example, when all constituent materials of any layer are organic materials, at least one of the constituent materials is of an N-type, at least another constituent material is of a P-type, and the weight percent of the N-type material is less than 30% or the weight percent of the P-type material is less than 30%, the layer is a "doped" layer.

Hereinafter, a light emitting display device according to embodiments of the present disclosure will be described with reference to the accompanying drawings.

FIG. 1 is a sectional view showing a light emitting display device according to a first embodiment of the present disclosure. FIGS. 2A and 2B are adjacent layer-specific energy band diagrams of emission layers and electron blocking units of a first subpixel and a second subpixel of FIG. 1.

As shown in FIG. 1, in the light emitting display device according to the first embodiment of the present disclosure, a first subpixel SP1 and a second subpixel SP2 include first and second light emitting elements OLED1 and OLED2 including first and second emission layers 150 and 155 configured to emit different colors of light and first and second electron blocking units EBU1 and EBU2 adjacent to the first and second emission layers 150 and 155, respectively.

Each of the first subpixel SP1 and the second subpixel SP2 includes an anode 110, a first common layer HIL/HTL, a second common layer ETL/EIL, and a cathode 170.

The first subpixel SP1 may include a first emission layer EML1 150 provided between the first and second common layers HIL/HTL and ETL/EIL and a first electron blocking unit EBU1 disposed between the first common layer HIL/HTL and the first emission layer EML1 150. In the first electron blocking unit EBU1, at least two layers EBL1 and EBL2 are arranged such that energy bandgaps thereof are increased, as shown in FIG. 2A.

The second subpixel SP2 may include a second emission layer 155 provided between the first and second common layers HIL/HTL and ETL/EIL and a second electron blocking unit EBU2 disposed between the first common layer HIL/HTL and the second emission layer EML2 155. In the second electron blocking unit EBU2, at least two layers EBL2 and EBL3 are arranged such that energy bandgaps thereof are decreased, as shown in FIG. 2B.

Here, the first common layer under the first emission layer EML1 150, which is a layer related to hole injection and hole transport, may include a hole injection layer (HIL) 121 and a hole transport layer (HTL) 122. The hole injection layer (HIL) 121 and the hole transport layer (HTL) 122 may be identically configured in the first and second subpixels SP1 and SP2.

The second common layer is over the second emission layer EML2 155 and is a layer related to electron transport and electron injection. The second common layer may include an electron transport layer ETL 124. Depending on circumstances, the second common layer may further an electron injection layer EIL 160 on the electron transport layer ETL 124. Depending on circumstances, the second common layer may be constituted by a stack of a hole blocking layer HBL and an electron transport layer ETL.

In the light emitting display device according to the present disclosure, the first electron blocking unit EBU1 may be constituted by a stack of a first electron blocking layer 131 and a second electron blocking layer 132, and the second electron blocking unit EBU2 may be constituted by a stack of the second electron blocking layer 132 and a third electron blocking layer 133.

Here, the second electron blocking layer 132 may extend over the first and second subpixels SP1 and SP2, the first electron blocking layer 131 may be provided in only the first subpixel SP1, and the third electron blocking layer 133 may be provided in only the second subpixel SP2.

Here, the first electron blocking layer 131 and the third electron blocking layer 133 may include the same material. When the first electron blocking layer 131 and the third electron blocking layer 133 include the same material, the first electron blocking layer 131 may be formed by shifting a mask in the same chamber as the third electron blocking layer 133, whereby there are advantages in that material cost is reduced and no equipment is added at the time of structural change.

However, the present disclosure is not limited thereto. As long as the electron blocking layers are arranged in the first electron blocking unit EBU1 such that the energy bandgaps are increased and the electron blocking layers are arranged in the second electron blocking unit EBU2 such that the energy bandgaps are decreased, it is possible to prevent side leakage of current to adjacent subpixels. Consequently, the first electron blocking layer 131 and the third electron blocking layer 133 may not be identical to each other.

In the light emitting display device according to the present disclosure, each of the first and second electron blocking units EBU1 and EBU2, which are configured to prevent overflow of electrons or excitons from the first and second emission layers 150 and 155 to the first common layer HIL/HTL, is constituted by a plurality of layers. The difference in threshold voltage Vth between the subpixels SP1 and SP2 including the first and second emission layers 150 and 155 having different threshold voltages Vth is compensated for by the first and second electron blocking units EBU1 and EBU2, whereby high threshold voltage Vth of the second emission layer 155, and therefore the difference in threshold voltage between the first and second subpixels is reduced and driving voltage is reduced. That is, the difference in threshold voltage between the subpixels is reduced, whereby it is possible to prevent emission of another color of light due to leakage when a subpixel including a color emission layer having high threshold voltage is driven.

Here, the second electron blocking layer 132 may have a highest occupied molecular orbital (HOMO) level 0.1 eV or more lower than the HOMO level of each of the first and third electron blocking layers 131 and 133, and may have a lowest unoccupied molecular orbital (LUMO) level 0.1 eV or more higher than the LUMO level of each of the first and third electron blocking layers. That is, the second electron blocking layer 132 is made of a material having a low (deep) HOMO level and a high (shallow) LUMO level such that the energy bandgap can cover the energy bandgap (|HOMO−LUMO|) of each of the first and third electron blocking layers 131 and 133.

Meanwhile, in the second electron blocking unit EBU2, the third electron blocking layer 133 abutting the second emission layer 155 may have a HOMO level 0.2 eV or more higher than the HOMO level of a host of the second emission layer 155, and the third electron blocking layer 133 may have a high hole mobility of $5 \times 10^{-4}$ cm$^2$/Vs or more. The hole mobility of the third electron blocking layer 133 is higher than the hole mobility of the second electron blocking layer 132. As a result, it is possible to rapidly and smoothly transport holes to the second emission layer 155 abutting the third electron blocking layer 133, whereby it is possible to reduce high threshold voltage of the second emission layer 155, which is inherent, and to increase driving voltage.

Meanwhile, each of the first and third electron blocking layers 131 and 133 may be made of an electron blocking material represented by, for example, Chemical Formula 1 below.

Chemical Formual 1

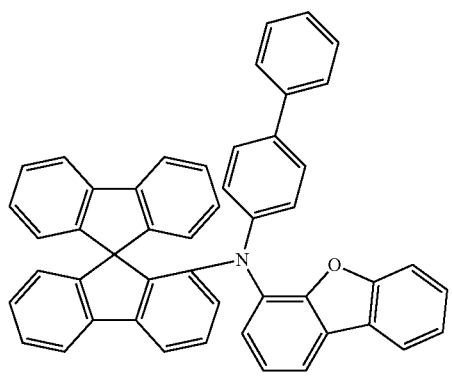

In addition, the second electron blocking layer 132 may be made of an electron blocking material represented by, for example, Chemical Formula 2 below.

Chemical Formula 2

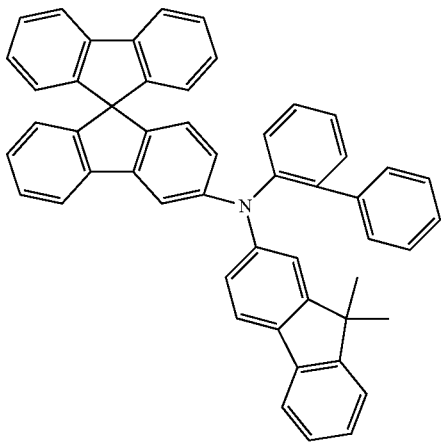

In Chemical Formula 1 and Chemical Formula 2, an amine substituent is substituted at another position in a spirobifluorene derivative to adjust the HOMO level of the material. However, this is an example. Another material may be used as long as the material has electron excitation characteristics and each of the first and third electron blocking layers 131 and 133 has a HOMO level 0.2 eV or more higher than the HOMO level of the host of the second emission layer 155 while having a high hole mobility of $5 \times 10^{-4}$ cm$^2$/Vs or more. Another material may be used as long as the second electron blocking layer 132 has electron blocking characteristics and has a great energy bandgap sufficient to cover the bandgap of the material for each of the first and third electron blocking layers 131 and 133.

The HOMO and LUMO levels compared in this specification are based on a vacuum level, and have negative values. Consequently, that one of the two values is lower than the other means that the one is lower based on the vacuum level and has a greater absolute value.

When first and second electron blocking units EBU1 and EBU2 abutting first and second emission layers 150 and 155 having different threshold voltages while having different dispositions are used, as in the light emitting display device according to the present disclosure, it is possible to reduce the difference in threshold voltage between two subpixels to 0.4 V or less, to effectively reduce leakage current, and to prevent light leakage.

In the light emitting display device according to the present disclosure, as described above, electron blocking units abutting different emission layers have different electron blocking layers. That is, in the same stack structure, an electron blocking layer abutting a color emission layer having a relatively high turn-on voltage, among color emission layers having a difference in threshold voltage, has high hole mobility in order to reduce threshold voltage, whereby the difference in threshold voltage between subpixels is reduced or minimized. Consequently, it is possible to prevent emission of another color of light due to leakage when a specific subpixel is turned on.

In addition, the electron blocking unit has a current supply compensation function for an emission layer having an energy bandgap different from the energy bandgaps of the other color emission layers due to characteristics of light emission or characteristics of material, whereby it is possible to reduce driving voltage and to improve efficiency.

Meanwhile, in the first subpixel SP1, an optical compensation layer OCL 123 may be further provided between the hole transport layer 122 and the first electron blocking unit EBU1. When the first emission layer 150 and the second emission layer 155 are different from each other and the first emission layer 150 emits long-wavelength light, the position of the first emission layer 150 at which optimal resonance occurs between the anode 110 and the cathode 170 is different from the position of the second emission layer 155. The optical compensation layer is provided in order to compensate for the distance difference. The optical compensation layer 123 may be made of a hole transport material. Depending on circumstances, the optical compensation layer may be made of the same material as the hole transport layer HTL (122) in the first common layer.

In addition, an electron injection layer 160 may be further included between the cathode 170 and the second common layer. When the electron injection layer 160 is an organic layer, the electron injection layer may be included in the second common layer. When the electron injection layer is made of an inorganic material including metal and/or halogen, the electron injection layer may be included as one of the constructions stacked on the cathode 170.

In the light emitting display device according to the present disclosure, one of the anode 110 and the cathode 170 may be a reflective electrode, and the other may be a transmissive electrode or a transflective electrode. The transmissive electrode may be made of indium tin oxide (ITO) or indium zinc oxide (IZO). The transflective electrode may be made of magnesium (Mg), silver (Ag), or zinc (Zn) or an alloy including at least one thereof. The reflective electrode may be made of at least one of silver, magnesium, aluminum, and zinc (Zn) or an alloy including some thereof.

Hereinafter, a light emitting display device including three different emission layers according to a second embodiment of the present disclosure will be described.

Figure 3:
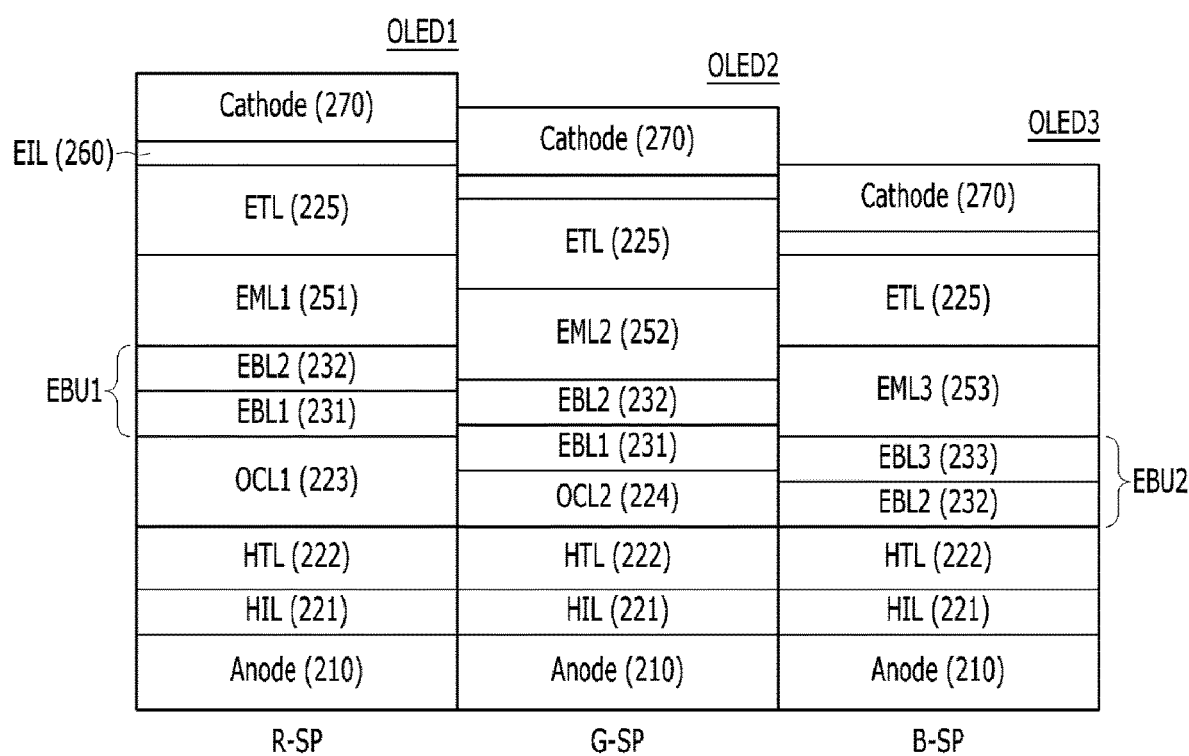
FIG. 3 is a sectional view showing a light emitting display device according to a second embodiment of the present disclosure.
Figure 4A:
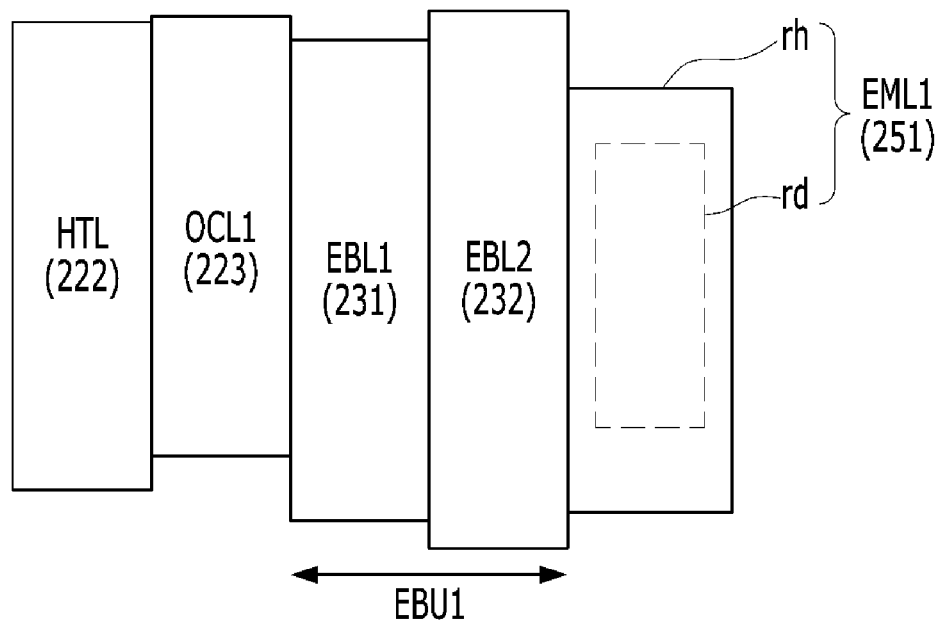
FIGS. 4A to 4C are energy band diagrams of respective emission layer and adjacent layers of electron blocking units at a first subpixel to a third subpixel of FIG. 3.
Figure 4B:
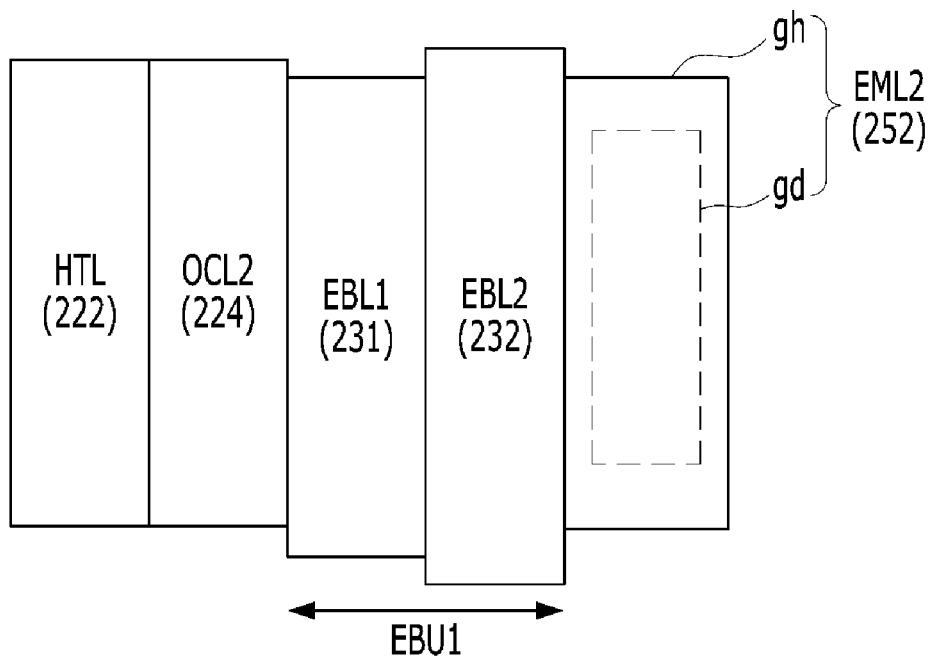
Figure 4C:
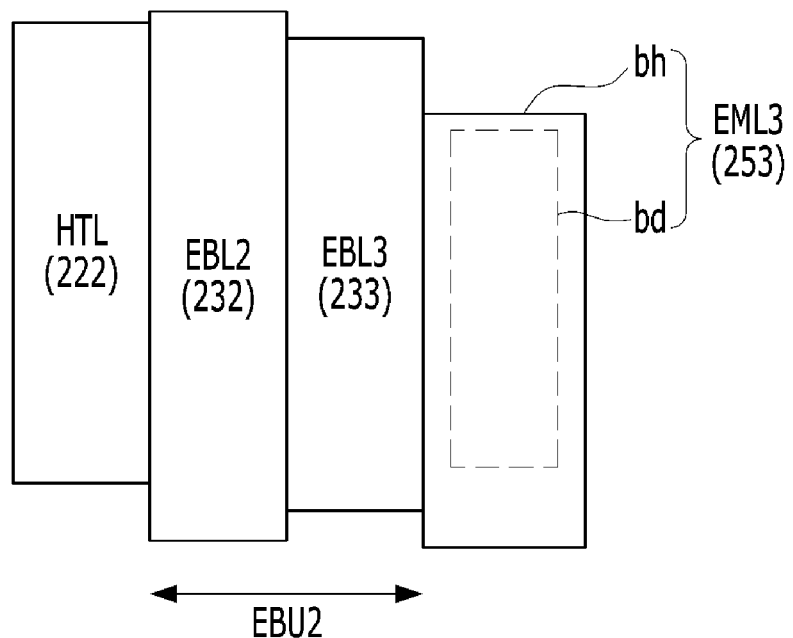
Figure 5:
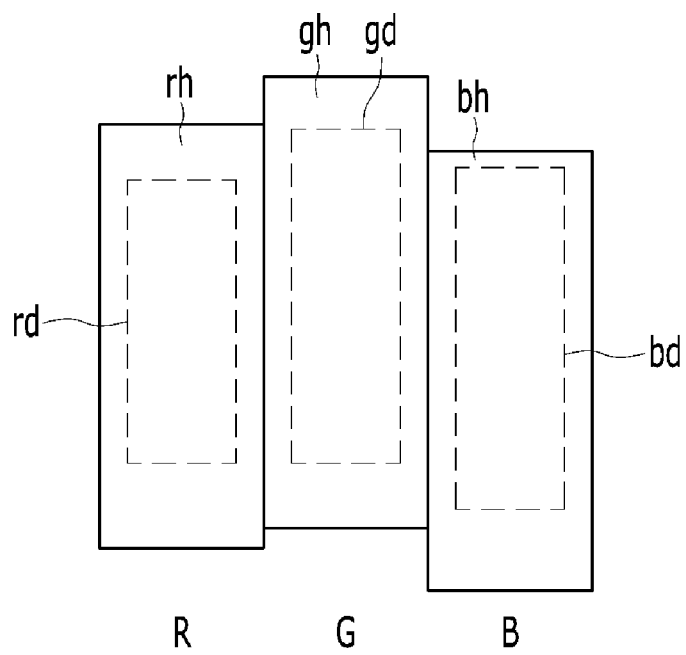
FIG. 5 is a band diagram showing energy bandgaps of emission layers of the light emitting display device according to the second embodiment.

FIG. 3 is a sectional view showing a light emitting display device according to a second embodiment of the present disclosure, FIGS. 4A to 4C are adjacent layer-specific band diagrams of emission layers and electron blocking units of a first subpixel to a third subpixel of FIG. 3, and FIG. 5 is a band diagram showing energy bandgaps of emission layers of the light emitting display device according to the second embodiment.

In the following description, a first subpixel R-SP is a red subpixel, a second subpixel G-SP is a green subpixel, and a third subpixel B-SP is a blue subpixel. However, this is an example. In the presented example, it is assumed that a third emission layer B-EML of the third subpixel B-SP has a higher threshold voltage than first and second emission layers. Depending on circumstances, ingredients of hosts provided at red, green, and blue emission layers may be adjusted such that a color emission layer other than the blue emission layer has high threshold voltage. In this case, a subpixel having a color emission layer having high threshold voltage may be provided with an electron blocking unit having an energy bandgap relationship inverted with respect to another subpixel.

As shown in FIG. 3, the light emitting display device according to the second embodiment of the present disclosure may include first to third subpixels R-SP, G-SP, and B—SP each having an anode 210, a first common layer HIL/HTL, a second common layer ETL/EIL, and a cathode 270 opposite each other, a first emission layer EML1 251 and a second emission layer EML2 252 provided between the first and second common layers HIL/HTL and ETL/EIL of each of the first and second subpixels R-SP and G-SP, a first electron blocking unit EBU1 including at least two layers EBL1 and EBL2 arranged such that energy bandgaps are increased between the first common layer HIL/HTL and the first and second emission layers 251 and 252 of each of the first and second subpixels R-SP and G-SP, as shown in FIGS. 4A and 4B, and a second electron blocking unit EBU2 including at least two layers EBL2 and EBL3 arranged such that energy bandgaps are decreased between the first common layer HIL/HTL and a third emission layer 253 of the third subpixel B-SP, as shown in FIG. 4C.

Here, the first emission layer 251, which has the longest wavelength, has an emission peak at 600 nm to 650 nm. The first emission layer 251 may emit red light. As shown in FIG. 5, the first emission layer 251 includes a red host rh and a red dopant rd.

The second emission layer 252, which has an intermediate wavelength, has an emission peak at 510 nm to 590 nm, and may emit green light. As shown in FIG. 5, the second emission layer 252 includes a green host gh and a green dopant gd.

The third emission layer 253, which has a short wavelength, has an emission peak at 440 nm to 490 nm, and may emit blue light. As shown in FIG. 5, the third emission layer 253 includes a blue host bh and a blue dopant bd.

As shown in FIG. 5, the first to third emission layers 251, 252, and 253, which emit different colors of light, may include different hosts and different dopants due to differences in wavelength, emission properties, and efficiency, and thus have different characteristics in energy bandgaps. In the third emission layer 253, the blue dopant bd has a relatively wide energy bandgap, and it is beneficial for the blue host bh to be included to such an extent that the energy bandgap of the blue dopant bd can be received such that the blue dopant bd participates in excitation. As a result, it is beneficial for the third emission layer 253 to have a lower HOMO level than the first and second emission layers 251 and 252, which is one of causes of increase in threshold voltage of the third emission layer 253.

In the light emitting display device according to the present disclosure, a third electron blocking layer 233 of the second electron blocking unit EBU2 abutting the third emission layer 253, which has high threshold voltage, may have a HOMO level 0.2 eV or more higher than the HOMO level of the third emission layer 253, and the third electron blocking layer 233 may have a hole mobility of $5\times10^{-4}$ $cm^2/Vs$ or more, which is greater than the hole mobility of a second electron blocking layer 232. Here, the third electron blocking layer 233 has a function of compensating for the supply of current to the third emission layer 253, whereby it is possible to improve efficiency while reducing driving voltage of the third subpixel SP3.

In the first subpixel SP1, a first optical compensation layer OCL1 223 may be further provided between a hole transport layer 222 and the first electron blocking unit EBU1. In the second subpixel SP2, a second optical compensation layer OCL2 224 may be further provided between a hole transport layer 222 and the first electron blocking unit EBU1.

Since optical distances required for the first to third emission layers 251, 252, and 253 are different from each other, the distances are compensated using the first and second optical compensation layers 223 and 224. The third emission layer 253, which has a relatively short wavelength, may be provided with no optical compensation layer.

The optical distances may be based on thicknesses of the first to third emission layers 251, 252, and 253. When the difference between the optical distances is great, the thicknesses of the emission layers are increased, and therefore optical distances may be compensated using both the thicknesses and the optical compensation layers.

In addition, an electron injection layer 260 may be further included between the cathode 270 and the second common layer CMU. When the electron injection layer EIL 260 is an organic layer, the electron injection layer may be included in the second common layer. When the electron injection layer EIL 260 is made of an inorganic material including metal and/or halogen, the electron injection layer EIL 260 may be included as one of the constructions stacked on the cathode 270.

In the light emitting display device according to the present disclosure, one of the anode 210 and the cathode 270 may be a reflective electrode, and the other may be a transmissive electrode or a transflective electrode.

In the light emitting display device according to each of the first and second embodiments of the present disclosure, a single stack OS is provided between the anode and the cathode. However, the present disclosure is not limited thereto. In a structure including a plurality of stacks, different electron blocking units may be applied to the respective subpixels. When a subpixel has a plurality of stacks, the electron blocking unit is provided so as to abut each emission layer for each stack. The same electron blocking unit may be provided for the plurality of stacks, or in a subpixel including an emission layer having high threshold voltage, only some stacks may each optionally have an electron blocking unit disposed in a direction in which the energy bandgap is decreased.

Hereinafter, a method of providing the electron blocking unit of the light emitting display device according to the present disclosure will be described.

Figure 6A:
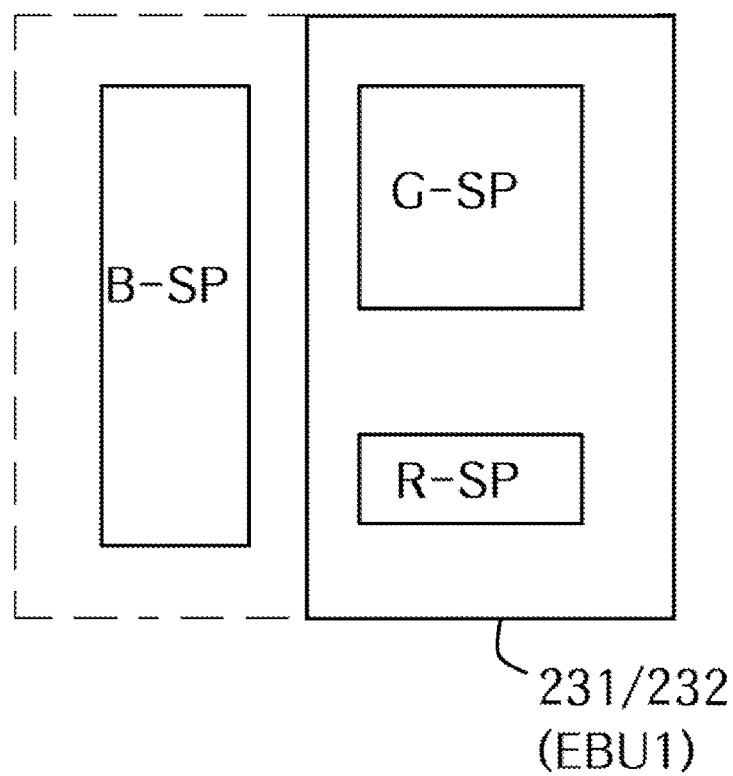
FIGS. 6A and 6B are views showing subpixel correspondence of layers of an electron blocking unit according to an embodiment of the light emitting display device of the present disclosure.
Figure 6B:
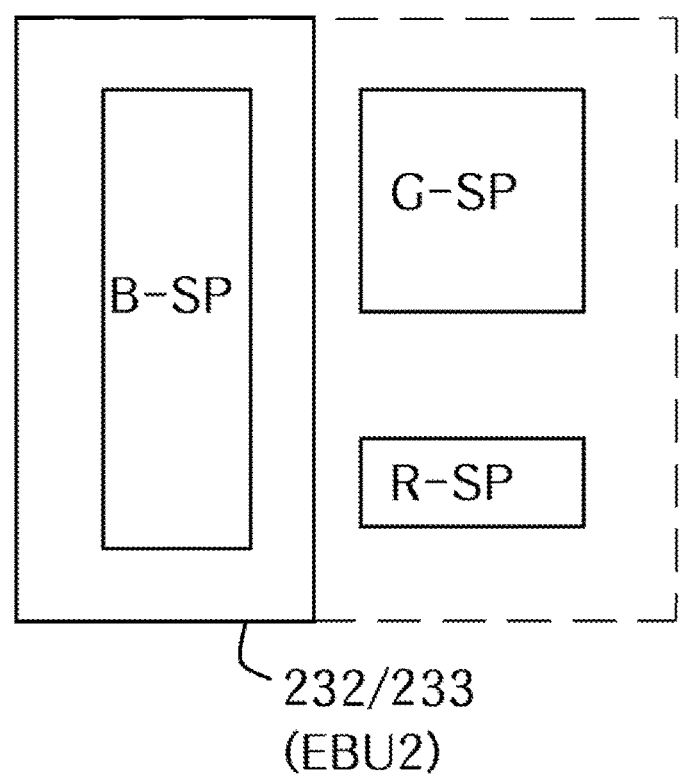

FIGS. 6A and 6B are views showing layer-specific subpixel correspondence of an electron blocking unit according to an embodiment of the light emitting display device of the present disclosure.

The method of providing the electron blocking unit described hereinafter is a method of forming the electron blocking unit in the same chamber. The chamber is provided with a mask selectively having an opening for the first subpixel R-SP and the second subpixel G-SP and having a shielding portion for the third subpixel B-SP. The mask may be shifted. When the mask is shifted, the opening of the mask corresponds to the third subpixel B-SP, and the shielding portion corresponds to each of the first and second subpixels R-SP and G-SP.

As shown in FIG. 6A, a first electron blocking material EB1 and a second electron blocking material EB2 are sequentially supplied onto the first common layer HIL/HTL or the optical compensation layers 223 and 224 of each subpixel of FIG. 3 using the mask that is selectively open for the first subpixel R-SP and the second subpixel G-SP in order to form a first electron block layer EBL1 (231) and a second electron block layer EBL2 (232) at the first subpixel R-SP and the second subpixel G-SP.

Subsequently, as shown in FIG. 6B, in the state in which the third subpixel B-SP is opened and the first and second subpixels R-SP and G-SP are shielded by shifting the mask, a second electron blocking material EB2 and a first electron blocking material EB1 are sequentially supplied in order to sequentially deposit a second electron blocking layer EBL2 (232) and a third electron blocking layer EBL3 (233) at the third subpixel B-SP.

As a result, the second electron blocking layer 232 has continuity over the first to third subpixels R-SP, G-SP, and B-SP, the first electron blocking layer 231 made of the first electron blocking material EB1 is located under the second electron blocking layer 232 at the first and second subpixels R-SP and G-SP, and the third electron blocking layer 233 made of the first electron blocking material EB1 is located on the second electron blocking layer 232 at the third subpixel B-SP, whereby it is possible to provide an electron blocking unit having an inverted structure between the first and second subpixels R-SP and G-SP and the third subpixel B-SP. In addition, it is possible to reduce threshold voltage of the third subpixel B-SP and to reduce driving voltage due to this structure.

In the example described above, the subpixels are disposed in a stripe structure. However, the present disclosure is not limited thereto. For example, even in the case in which R-G-B-G rhombus arrangement is provided as the case in which the ratio among red subpixels, blue subpixels, and green subpixels is changed, the first and second electron blocking units may be disposed as shown in FIGS. 1 and 3 through distinguishing between the blue subpixel and the other color subpixels, whereby threshold voltage of the blue emission layer, which is relatively high, may be reduced, and therefore it is possible to prevent leakage of current between the subpixels and to prevent a phenomenon in which other colors of light are visible when the blue subpixel emits light.

Hereinafter, connection between a light emitting element and a thin film transistor in the light emitting display device according to the present disclosure will be described.

FIG. 7 is a sectional view showing connection between a light emitting element and a thin film transistor according to an example in the light emitting display device of the present disclosure.

The construction of a thin film transistor TFT connected to anodes 110 of subpixels will be described with reference to FIG. 7.

A buffer layer 105 is provided on a substrate 100, and first and second semiconductor layers 1110 and 1111 are provided on the buffer layer 105. The buffer layer 105 performs a function of preventing impurities remaining in the substrate 100 from being introduced into the first and second semiconductor layers 1110 and 1111. Each of the first and second semiconductor layers 1110 and 1111 may be an amorphous or crystalline silicon semiconductor layer or a transparent oxide semiconductor layer. Opposite sides of the first semiconductor layer 1110 connected to a source electrode 1140 and a drain electrode 1160 may be areas into which impurities have been injected, and an intrinsic area of the first semiconductor layer 1110 between the areas into which impurities have been injected may function as a channel area.

Each of the first and second semiconductor layers 1110 and 1111 may include at least one of an oxide semiconductor layer, a polysilicon layer, and an amorphous silicon layer.

The second semiconductor layer 1111 may be located so as to overlap storage electrodes 1121 and 1141, which will be formed thereon, and may be used as an auxiliary storage electrode that increase capacitance of a storage capacitor when impurities are injected. Depending on circumstances, the second semiconductor layer 1111 may be omitted.

A gate insulating film 106 is provided so as to cover the first and second semiconductor layers 1110 and 1111, and a gate electrode 1120 and a first storage electrode 1121 are formed so as to overlap the intrinsic area of the first semiconductor layer 1110 and the second semiconductor layer 1111.

A first interlayer insulating film 107 is provided so as to cover the first and second semiconductor layers 1110 and 1111, the gate electrode 1120, and the first storage electrode 1121.

At the opposite sides of the first semiconductor layer 1110, the first interlayer insulating film 107 and the gate insulating film are selectively removed to form contact holes, and the source electrode 1140 and the drain electrode 1160 are connected to the first semiconductor layer 1110 via the contact holes. In the same process, a second storage electrode 1141 is formed on the first interlayer insulating film 107 overlapping the first storage electrode 1121.

Here, a first thin film transistor TFT configured to drive a light emitting element OLED in an emission portion E is constituted by the first semiconductor layer 1110, the gate electrode 1120, which overlaps a channel area of the first semiconductor layer, and the source electrode 1140 and the drain electrode 1160, which are connected to opposite sides of the first semiconductor layer 1110, sequentially disposed from below.

In addition, a storage capacitor STC is constituted by the storage electrodes 1121 and 1141, which overlap each other in the state in which the first interlayer insulating film 107 is interposed therebetween.

A second interlayer insulating film 108 is formed so as to cover the thin film transistor TFT and the storage capacitor STC.

Here, the thin film transistor TFT and the storage capacitor STC, each of which includes light shielding metal layers, may be disposed so as not to overlap a transmission portion T/E, and thus may be disposed so as to overlap the emission portion E (RE and BE) or a bank (115) formation portion. Here, the bank 115 may be located between the transmission portion T/E and the emission portion E or between a red emission area RE and a blue emission area BE of the emission portion E. In the emission portion E, a reflective anode 110 may prevent metal layers disposed thereunder from being visible. At a region at which the bank 115 is located, visibility of a lower construction may be prevented due to disposition of the thick bank 115.

Meanwhile, a planarization film 109 is further formed so as to cover the second interlayer insulating film 108 while planarizing the surface thereof, and the planarization film 109 and the second interlayer insulating film 108 may be selectively removed to form a connection portion CT1, via which the thin film transistor TFT and the anode 110 may be connected to each other. FIG. 7 shows a two-layered structure including a reflective anode 1101 and a transparent anode 1102; however, transparent anodes may be provided above and below in the state in which a reflective anode is disposed therebetween. For example, the reflective anode of the anode 110 may be made of a reflective metal, such as aluminum, an aluminum alloy, silver, or a silver alloy. In order to improve reflection efficiency, an APC (Ag—Pd—Cu) alloy may be used.

In addition, a cathode 170 opposite the anode 110 may be made of a transflective metal, such as a magnesium alloy, a silver alloy, silver, magnesium, or MgAg. Depending on circumstances, a transparent metal, such as indium tin oxide (ITO) or indium zinc oxide (IZO), may be used.

In the light emitting display device according to the present disclosure, light is emitted outside through the cathode 170. A capping layer may be further provided on the cathode 170 of FIGS. 1 and 3 in order to increase the amount of light that is emitted outside.

An organic stack OS of FIG. 7 includes components common to the bank 115 and the emission portions E of the subpixels. For the blue subpixel B-SP, the green subpixel G-SP, and the red subpixel R-SP, which emit different colors of light, at least the emission layers are patterned in a state of being divided for respective emission portions.

Meanwhile, a combination of the substrate 100 and the thin film transistor array formed on the substrate 100 may be referred to as a thin film transistor array substrate.

Hereinafter, significance of the light emitting display device according to the present disclosure will be described through experiments.

Figure 8:
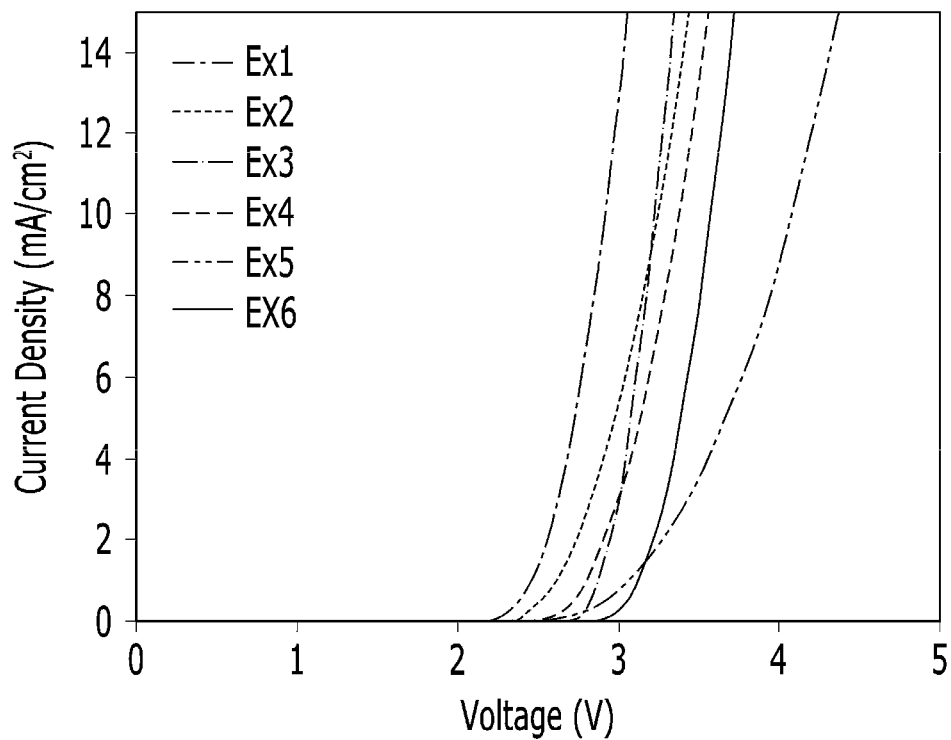
FIG. 8 is a graph showing threshold voltage according to disposition of an electron blocking unit in first to sixth experimental examples (Ex1 to Ex6) of FIG. 3.
Figure 9:
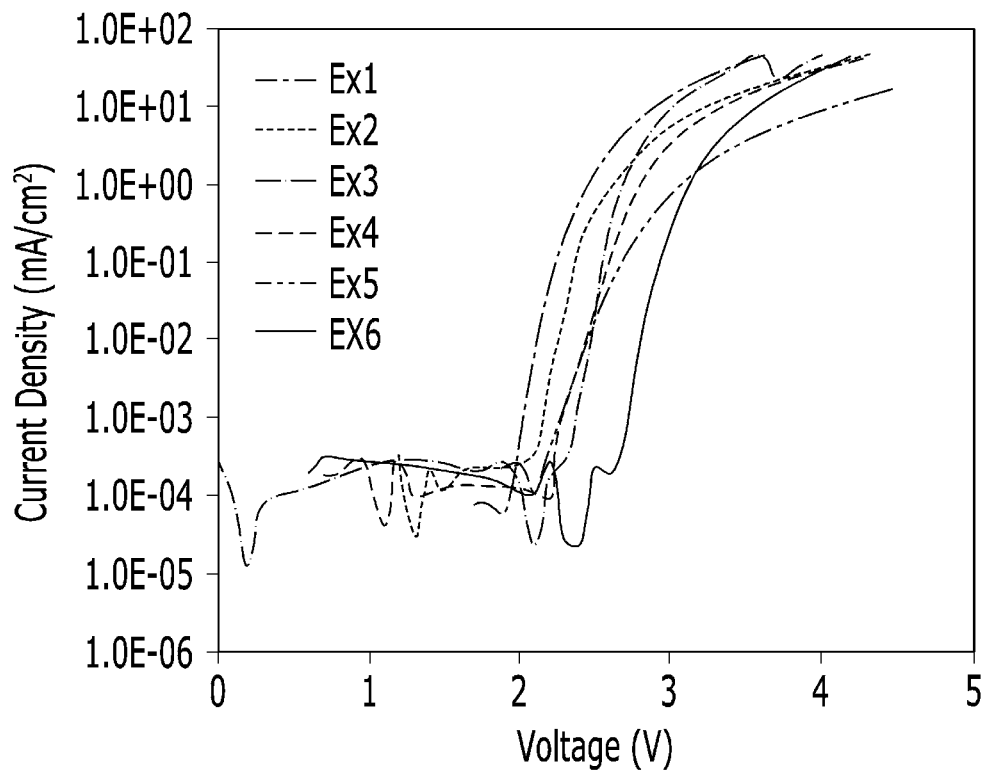
FIG. 9 is a graph showing driving voltage according to disposition of the electron blocking unit in the first to sixth experimental examples (Ex1 to Ex6) of FIG. 3.

FIG. 8 is a graph showing threshold voltage according to disposition of an electron blocking unit in first to sixth experimental examples (Ex1 to Ex6), and FIG. 9 is a graph showing driving voltage according to disposition of the electron blocking unit in the first to sixth experimental examples (Ex1 to Ex6).

TABLE 1

| Structure | Electron blocking unit structure-Subpixel | Threshold voltage (V) | Driving voltage (V) | Efficiency (%) |
| --- | --- | --- | --- | --- |
| Ex1 | EB1/EB2 (EBU1)-R_SP | 2.28 | 3.7 | 102 |
| Ex2 | EB1/EB2 (EBU1)-G_SP | 2.21 | 3.7 | 102 |
| Ex3 | EB1/EB2 (EBU1)-B_SP | 2.71 | 3.9 | 100 |
| Ex4 | EB2/EB1 (EBU2)-R_SP | 2.02 | 3.4 | 97 |
| Ex5 | EB2/EB1 (EBU2)-G_SP | 2.07 | 3.4 | 97 |
| Ex6 | EB2/EB1 (EBU2)-B_SP | 2.38 | 3.6 | 100 |

Referring to Table 1 above, in the first to third experimental examples (Ex1, Ex2, and Ex3), threshold voltage (V), driving voltage (V), and efficiency were evaluated using the first electron blocking unit EBU1 of FIGS. 1 and 3 having an increasing energy bandgap with decreasing distance from the emission layer of each of the R, G, B, subpixels, and in the fourth to sixth experimental examples (Ex4, Ex5, and Ex6), threshold voltage (V), driving voltage (V), and efficiency were evaluated using the second electron blocking unit EBU2 of FIGS. 1 and 3 having a decreasing energy bandgap with decreasing distance from the emission layer of each of the R, G, B, subpixels. The material represented by Chemical Formula 1 was used as a first electron blocking material EB1, which was a material for the first electron blocking layers 131 and 231 of the first electron blocking unit EBU1 and materials for the third electron blocking layers 133 and 233 of the second electron blocking unit EBU2, and the material represented by Chemical Formula 2 was used as a second electron blocking material EB2, which was a material for the second electron blocking layers 132 and 232 of each of the first and second electron blocking units EBU1 and EBU2.

Referring to Table 1 above and FIGS. 8 and 9, it can be seen that, when the first electron blocking unit is provided for each of the red and green subpixels and the second electron blocking unit is provided for each of the blue subpixel, it is possible to effectively reduce the difference in threshold voltage between the subpixels. In such a combination structure, it is possible to prevent a phenomenon in which other colors of light are visible when a specific subpixel is turned on, and therefore it is possible to improve efficiency.

Referring to Table 1 above and FIGS. 8 and 9, when comparing the respective color subpixels, the threshold voltage of the blue subpixel is 2.39 V when the second electron blocking unit is provided, and the threshold voltages of the red and green subpixels are 2.28 V and 2.21 V when the first electron blocking unit is provided. Consequently, the difference in threshold voltage between the subpixels is 0.17 V or less, and therefore it is possible to prevent a phenomenon in which leakage current is generated due to a great threshold voltage difference.

Hereinafter, advantages of an electron blocking unit having a multilayered structure including two or more layers according to the present disclosure will be described with reference to Table 2.

TABLE 2

| Structure | Electron blocking unit structure-Subpixel | Threshold voltage (V) | Driving voltage (V) | Efficiency (%) |
|---|---|---|---|---|
| Ex7 | EB2-R_SP | 2.45 | 3.9 | 100 |
| Ex8 | EB2-G_SP | 2.39 | 3.9 | 100 |
| Ex9 | EB2-B_SP | 2.94 | 4.1 | 100 |
| Ex10 | EB1-R_SP | 2.19 | 3.6 | 96 |
| Ex11 | EB1-G_SP | 2.25 | 3.6 | 96 |
| Ex12 | EB1-B_SP | 2.94 | 3.8 | 99 |

Referring to Table 2 above, in the seventh to ninth experimental examples (Ex7, Ex8, and Ex9), an electron blocking layer made of a second electron blocking material EB2 having a single layer (see Chemical Formula 2) was disposed so as to abut the emission layer of each of the R, G, B, subpixels, instead of the electron blocking unit mentioned above, and threshold voltage (V), driving voltage (V), and efficiency were evaluated. Also, in the tenth to twelfth experimental examples (Ex10, Ex11, and Ex12), an electron blocking layer made of a first electron blocking material EB1 having a single layer (see Chemical Formula 1) was disposed so as to abut the emission layer of each of the R, G, B, subpixels, instead of the electron blocking unit mentioned above, and threshold voltage (V), driving voltage (V), and efficiency were evaluated.

When the first electron blocking material EB1 is used, the threshold voltage and driving voltage of each of the red, green, and blue subpixels are lower than when the second electron blocking material EB2 is used; however, discharge of electrons to the emission layers is not completely prevented, whereby efficiency is lowered.

In Tables 1 and 2, the experimental examples were compared to each other in terms of efficiency on the assumption that the efficiency of each of the seventh to ninth experimental examples (Ex7, Ex8, and Ex9) when the single electron blocking layer was made of the second electron blocking material EB2 was 100%. Referring to Table 1, it can be seen that, when the first electron blocking unit is provided for each of the red and green subpixels and the second electron blocking unit is provided for the blue subpixel, efficiency is higher than when EB2 made of a single material is used.

Hereinafter, structure-specific effects in terms of power consumption and side leakage of current will be described with reference to Table 3.

TABLE 3

| Structure | Electron blocking unit structure-Emission layer | Power consumption (%) | Side leakage of current (%) |
|---|---|---|---|
| Ex13 | Common EB2-R_SP, G_SP, B_SP | 100 | 100 |
| Ex14 | Common EB1-R_SP, G_SP, B_SP | 98 | 76 |
| Ex15 | Common EB1/EB2 (EBU1)-R_SP, G_SP, B_SP | 96 | 91 |
| Ex16 | Common EB2/EB1 (EBU2)-R_SP, G_SP, B_SP | 95 | 66 |
| Ex17 | EB1/EB2 (EBU1)-R_SP, G_SPEB2/EB1 (EBU2)-B_SP | 93 | 30 |

In the thirteenth experimental example (Ex13) to the sixteenth experimental example (Ex16), a common electron blocking layer or a common electron blocking unit was applied to each of the red, green, and blue subpixels R_SP, G_SP, and B_SP, wherein a second electron blocking material EB2 (see Chemical Formula 2), a first electron blocking material EB1 (see Chemical Formula 1), a sequential stack structure of the first and second electron blocking materials EB1 and EB2, and a sequential stack structure of the second and first electron blocking materials EB2 and EB1 were respectively applied. In the seventeenth experimental example (Ex17), a first electron blocking unit EBU1 (EB1 and EB2) was applied to each of the red and green subpixels R_SP and G_SP, and a second electron blocking unit EBU2 (EB2 and EB1) was applied to the blue subpixel B_SP.

As shown in Table 3, it can be seen that power consumption of the seventeenth experimental example (Ex17) according to the second embodiment of the present disclosure is lower than power consumption of the other experimental examples and that leakage current of the seventeenth experimental example is about 0.3 times leakage current of the thirteenth experimental example (Ex13), e.g., considerable improvement is achieved.

That is, in the light emitting display device according to the present disclosure, the electron blocking unit, which is configured to prevent overflow of electrons or excitons from the emission layer, is constituted by a plurality of layers, and in subpixels including color emission layers having different threshold voltages, electron blocking units adjacent to different color emission layers have different electron blocking layers. That is, in the same stack structure, an electron blocking layer abutting a color emission layer having a relatively high turn-on voltage, among color emission layers having a relative difference in threshold voltage, has high hole mobility in order to reduce threshold voltage, whereby the difference in threshold voltage between subpixels is reduced or minimized. Consequently, it is possible to prevent emission of another color of light due to leakage when a specific subpixel is turned on.

In addition, the electron blocking unit has a current supply compensation function for an emission layer having an energy bandgap different from the energy bandgaps of the other color emission layers due to characteristics of light emission or characteristics of material, whereby it is possible to reduce driving voltage and to improve efficiency.

To this end, a light emitting display device according to an embodiment of the present disclosure may include a first subpixel and a second subpixel each including an anode and a cathode opposite each other and a first common layer and a second common layer provided between the anode and the cathode, a first emission layer provided between the first and second common layers of the first subpixel, a second emission layer provided between the first and second common layers of the second subpixel, a first electron blocking unit provided between the first common layer and the first emission layer of the first subpixel, the first electron blocking unit including at least two layers arranged such that energy bandgaps thereof are increased, and a second electron blocking unit provided between the first common layer and the second emission layer of the second subpixel, the second electron blocking unit including at least two layers arranged such that energy bandgaps thereof are decreased.

The first electron blocking unit may be constituted by a stack of a first electron blocking layer and a second electron blocking layer, and the second electron blocking unit may be constituted by a stack of the second electron blocking layer and a third electron blocking layer.

The first electron blocking layer and the third electron blocking layer may include the same material.

The second electron blocking layer may extend over the first and second subpixels, the first electron blocking layer may be provided in only the first subpixel, and the third electron blocking layer may be provided in only the second subpixel.

The third electron blocking layer may have a HOMO level 0.2 eV or more higher than the HOMO level of the second emission layer.

The second electron blocking layer may have a HOMO level 0.1 eV or more lower than the HOMO level of the third electron blocking layer and a LUMO level 0.1 eV or more higher than the LUMO level of the first electron blocking layer.

Each of the first electron blocking layer and the third electron blocking layer may have higher hole mobility than the second electron blocking layer, and the hole mobility of each of the first electron blocking layer and the third electron blocking layer may be $5\times10^{-4}$ cm$^2$/Vs or more.

The difference in threshold voltage between the first subpixel and the second subpixel may be 0.4 V or less.

The second subpixel may have higher threshold voltage than the first subpixel.

A light emitting display device according to another embodiment of the present disclosure may include first to third subpixels each including an anode and a cathode opposite each other and a first common layer and a second common layer provided between the anode and the cathode, a first emission layer and a second emission layer provided between the first and second common layers of each of the first and second subpixels, respectively, a first electron blocking unit provided between the first common layer and the first and second emission layers of the each of the first and second subpixels, the first electron blocking unit including at least two layers arranged such that energy bandgaps thereof are increased, and a second electron blocking unit provided between the first common layer and a third emission layer of the third subpixel, the second electron blocking unit comprising at least two layers arranged such that energy bandgaps thereof are decreased.

The third emission layer may emit light having a shorter wavelength than the first emission layer.

The third emission layer may have higher threshold voltage than each of the first and second emission layers.

The first electron blocking unit may be constituted by a stack of a first electron blocking layer and a second electron blocking layer, and the second electron blocking unit may be constituted by a stack of the second electron blocking layer and a third electron blocking layer.

The first electron blocking layer and the third electron blocking layer may include the same material.

The second electron blocking layer may extend over the first to third subpixels, the second electron blocking layer may abut the first and second emission layers, and the third electron blocking layer may abut the third emission layer.

The third electron blocking layer has a HOMO level 0.2 eV or more higher than the HOMO level of the third emission layer.

The second electron blocking layer may have a HOMO level 0.1 eV or more lower than the HOMO level of the third electron blocking layer and a LUMO level 0.1 eV or more higher than the LUMO level of the first electron blocking layer. The second electron blocking layer may have a HOMO level 0.1 eV or more lower than the HOMO level of each of the first and third electron blocking layers and a LUMO level 0.1 eV or more higher than the LUMO level of each of the first and third electron blocking layers.

Each of the first electron blocking layer and the third electron blocking layer may have higher hole mobility than the second electron blocking layer, and the hole mobility of each of the first electron blocking layer and the third electron blocking layer may be $5\times10^{-4}$ cm$^2$/Vs or more.

The invention relates to a display, which can be used for a display with a luminous element.

It will be apparent to those skilled in the art that the present disclosure described above is not limited to the above embodiments and the accompanying drawings and that various substitutions, modifications, and variations can be made without departing from the technical idea of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light emitting display device comprising:
   a first subpixel and a second subpixel each including an anode and a cathode opposite each other and a first common layer and a second common layer provided between the anode and the cathode;
   a first emission layer provided between the first and second common layers of the first subpixel;
   a second emission layer provided between the first and second common layers of the second subpixel;
   a first electron blocking unit provided between the first common layer and the first emission layer of the first subpixel, the first electron blocking unit including at least two layers arranged such that energy bandgaps thereof are increased; and
   a second electron blocking unit provided between the first common layer and the second emission layer of the second subpixel, the second electron blocking unit including at least two layers arranged such that energy bandgaps thereof are decreased.

2. The light emitting display device according to claim 1, wherein
   the first electron blocking unit includes a stack of a first electron blocking layer and a second electron blocking layer, and
   the second electron blocking unit includes a stack of the second electron blocking layer and a third electron blocking layer.

3. The light emitting display device according to claim 2, wherein the first electron blocking layer and the third electron blocking layer include an identical material.

4. The light emitting display device according to claim 2, wherein
the second electron blocking layer extends over the first and second subpixels,
the first electron blocking layer is provided in only the first subpixel, and
the third electron blocking layer is provided in only the second subpixel.

5. The light emitting display device according to claim 2, wherein the third electron blocking layer has a HOMO level 0.2 eV or more higher than a HOMO level of the second emission layer.

6. The light emitting display device according to claim 2, wherein the second electron blocking layer has a HOMO level 0.1 eV or more lower than a HOMO level of each of the first and third electron blocking layers and a LUMO level 0.1 eV or more higher than a LUMO level of each of the first and third electron blocking layers.

7. The light emitting display device according to claim 2, wherein each of the first electron blocking layer and the third electron blocking layer has higher hole mobility than the second electron blocking layer, and the hole mobility of each of the first electron blocking layer and the third electron blocking layer is $5\times10^{-4}$ cm$^2$/Vs or more.

8. The light emitting display device according to claim 1, wherein a difference in threshold voltage between the first subpixel and the second subpixel is 0.4 V or less.

9. The light emitting display device according to claim 1, wherein the second subpixel has higher threshold voltage than the first subpixel.

10. A light emitting display device comprising:
a first subpixel, a second subpixel and a third subpixel, each including an anode and a cathode opposite each other and a first common layer and a second common layer provided between the anode and the cathode;
a first emission layer and a second emission layer provided between the first and second common layers of each of the first and second subpixels, respectively;
a first electron blocking unit provided between the first common layer and the first and second emission layers of the each of the first and second subpixels, the first electron blocking unit including at least two layers arranged such that energy bandgaps thereof are increased; and
a second electron blocking unit provided between the first common layer and a third emission layer of the third subpixels, the second electron blocking unit including at least two layers arranged such that energy bandgaps thereof are decreased.

11. The light emitting display device according to claim 10, wherein the third emission layer is an emission layer configured to emit light having a shorter wavelength than the first emission layer.

12. The light emitting display device according to claim 10, wherein the third emission layer has higher threshold voltage than the first and second emission layers.

13. The light emitting display device according to claim 10, wherein
the first electron blocking unit is includes a stack of a first electron blocking layer and a second electron blocking layer, and
the second electron blocking unit is includes a stack of the second electron blocking layer and a third electron blocking layer.

14. The light emitting display device according to claim 13, wherein the first electron blocking layer and the third electron blocking layer include an identical material.

15. The light emitting display device according to claim 13, wherein
the second electron blocking layer extends over the first to third subpixels,
the second electron blocking layer abuts the first and second emission layers, and
the third electron blocking layer abuts the third emission layer.

16. The light emitting display device according to claim 13, wherein the third electron blocking layer has a HOMO level 0.2 eV or more higher than a HOMO level of the third emission layer.

17. The light emitting display device according to claim 13, wherein the second electron blocking layer has a HOMO level 0.1 eV or more lower than a HOMO level of each of the first and third electron blocking layers and a LUMO level 0.1 eV or more higher than a LUMO level of each of the first and third electron blocking layers.

18. The light emitting display device according to claim 13, wherein each of the first electron blocking layer and the third electron blocking layer has higher hole mobility than the second electron blocking layer, and the hole mobility of each of the first electron blocking layer and the third electron blocking layer is $5\times10^{-4}$ cm$^2$/Vs or more.

* * * * *